United States Patent [19]
Taylor et al.

[11] Patent Number: 5,224,115
[45] Date of Patent: Jun. 29, 1993

[54] DISTRIBUTED FEEDBACK LASER IMPLEMENTED USING AN ACTIVE LATERAL GRATING

[75] Inventors: Geoffrey W. Taylor, Holmdel; Daniel P. Doctor, Morganville, both of N.J.

[73] Assignee: The United States of America as represented by the Secretary of the Air Force, Washington, D.C.

[21] Appl. No.: 731,688

[22] Filed: Jul. 17, 1991

[51] Int. Cl.⁵ .................................. H01S 3/19
[52] U.S. Cl. .............................. 372/50; 372/46; 372/96
[58] Field of Search ............. 372/44, 45, 46, 50, 372/96, 20

[56] References Cited

U.S. PATENT DOCUMENTS

| | | | |
|---|---|---|---|
| 3,760,292 | 9/1973 | Kogelnik et al. | 331/94.5 C |
| 4,347,612 | 8/1982 | Fekete et al. | 372/50 |
| 4,445,218 | 4/1984 | Coldren | 372/41 |
| 4,591,889 | 5/1986 | Gossard et al. | 357/4 |
| 5,084,894 | 1/1992 | Yamamoto | 372/50 |

*Primary Examiner*—James W. Davie
*Attorney, Agent, or Firm*—Irwin P. Garfinkle; Donald J. Singer

[57] ABSTRACT

A distributed feedback (DFB) laser for use in a bipolar field effect transistor laser (known as a BICFET laser) produces a single mode, stable, tunable laser. The single mode, stable, tunable characteristics of the laser are achieved by modifying the structure and operation of a previously disclosed high speed integrated heterojunction field-effect transistor laser by the inclusion of a grating in the n+ active regions to create a periodic refractive index profile. Independent operation of two n+ quantum wells provides frequency tuning through simultaneous and independent control of the mode spacing or mode frequency and the distributed feedback frequency.

5 Claims, 2 Drawing Sheets

DISTRIBUTED FEEDBACK LASER IMPLEMENTED USING AN ACTIVE LATERAL GRATING

STATEMENT OF GOVERNMENT INTEREST

The invention described herein may be manufactured and used by or for the Government for governmental purposes without the payment of any royalty thereon.

SUMMARY OF THE INVENTION

The present invention is for a distributed feedback (DFB) laser for use in a bipolar charge field effect transistor laser (known as a BICFET laser) to produce a single mode, stable, tunable laser. The single mode, stable, tunable characteristics of the laser are achieved by modifying the structure and operation of a previously disclosed high speed integrated heterojunction field-effect transistor laser by the inclusion of a grating in the n+ active regions to create a periodic refractive index profile. Independent operation of two n+ quantum wells provides frequency tuning through simultaneous and independent control of the mode spacing or mode frequency and the distributed feedback frequency.

BACKGROUND OF THE INVENTION

Recent progress in the performance of many optoelectric devices has allowed the development of optoelectronic circuit technology to become a viable prospect. The Inversion Channel Technology, which originated with the conception of the BICFET (see Taylor et al, IEEE Trans. Electron Device, Ed-32, No. 11, November 1985) and DOES (see Simmons et al, IEEE Trans. Electron Devices Ed-32, No. 5, pp 2345-2367, May 1987) has been further developed to include the HFET (see Taylor et al, Electron Lett., Vol. 22, No. 12, July 1986) and also see Taylor et al, Appl. Phys. Lett. 47 (12), p 1754-1756, 15 Jun. 1987. This invention is an advancement of the HFET, specifically by providing the HFET with means for obtaining a high speed structure with wavelength selectivity.

In brief, this invention modifies the Heterostructure Field Effect Laser device disclosed by Taylor et et al in Appl. Phys. Lett. 58(7), pages 666-668. Simply stated, the structure shown in the article is modified by incorporating a grating into the electrode region of the laser structure.

OTHER PRIOR ART

A search of the prior art revealed the following United States patents:

The U.S. Pat. No. 3,760,292 to Kogelnik teaches distributed feedback laser which does not require end mirror.

The U.S. Pat. No. 4,347,612 to Fekete, teaches a semiconductor injection laser.

The U.S. Pat. No. 4,445,218 to Coldren, teaches a grid-like conductive mask between the active region in a semiconductor and one of the electrodes between which the pump current flows. Changing the potential that is provided to the current mask regulates the light output from the laser and also provides means for adjusting the output wavelength where the current mask is close to the active region to cause the device to function as a distributed feedback laser.

The U.S. Pat. No. 4,591,889 to Gossard teaches a submonolayer superlattice semiconductor which has periodic compositional variations in a direction parallel to the substrate structure.

OBJECTS OF THE INVENTION

It is an object of the invention to provide a Heterojunction Field Effect Transistor with a grating to obtain a high speed structure with wavelength selectivity.

Another object of this invention is to use an ion-implanted grating in Heterojunction Field Effect Transistor to decrease the required length of the structure while attaining a periodic refractive index profile.

DESCRIPTION OF THE DRAWINGS

For further objects, and for a clearer understanding of the nature of this invention, reference should now be made to the following specification and to the accompanying drawing in which.

DESCRIPTION OF A PREFERRED EMBODIMENT

It should be noted that the basic structure of this invention, but without the improvement of the grating, is shown in the Taylor et al publication entitled Demonstration of a heterostructure field effect laser for optoelectronic integration, Appl. Phys. Lett. 58(7), 18 Feb. 1991. That publication is included herein by reference, and is reproduced in part.

Figure 2:
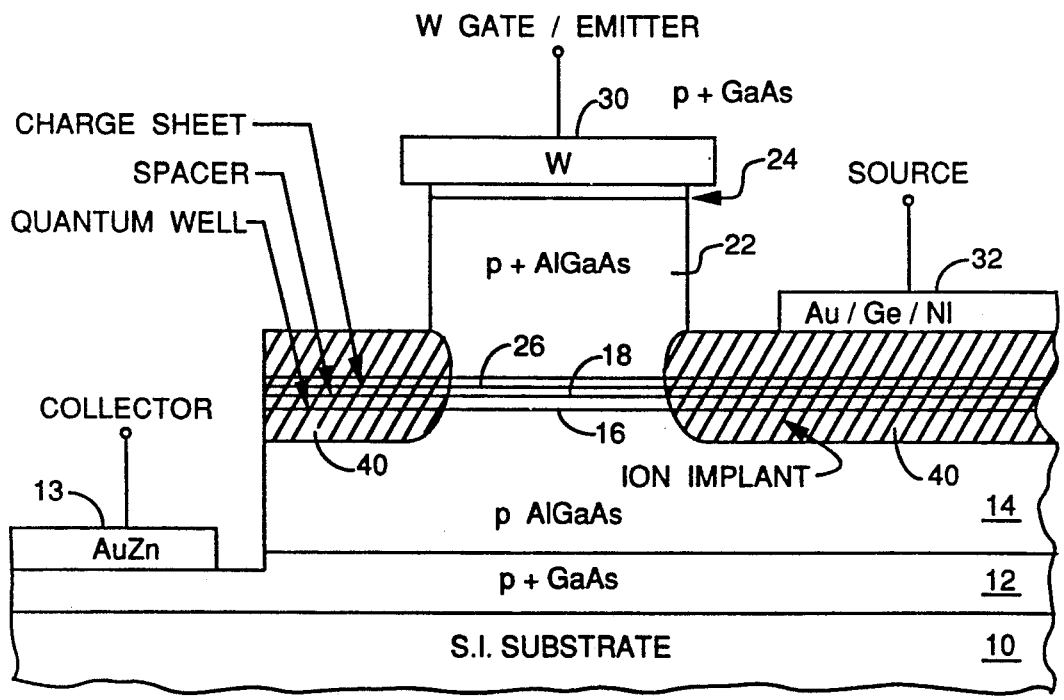
FIGS. 2 and FIGS. 3a and 3b are reproductions of the prior art Figures appearing in the Taylor et al publication entitled Demonstration of a heterostructure field effect laser for optoelectronic integration, Appl. Phys. Lett. 58(7), 18 Feb. 1991.
Figure 3A:
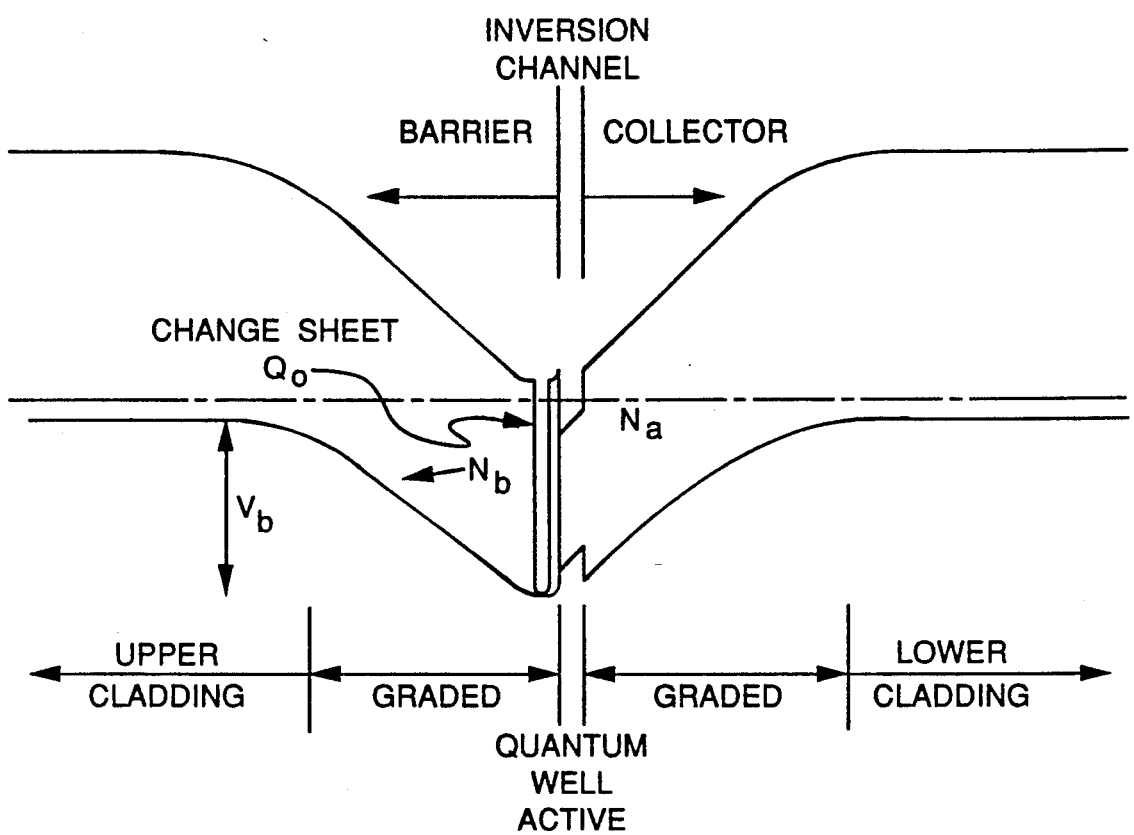
Figure 3B:
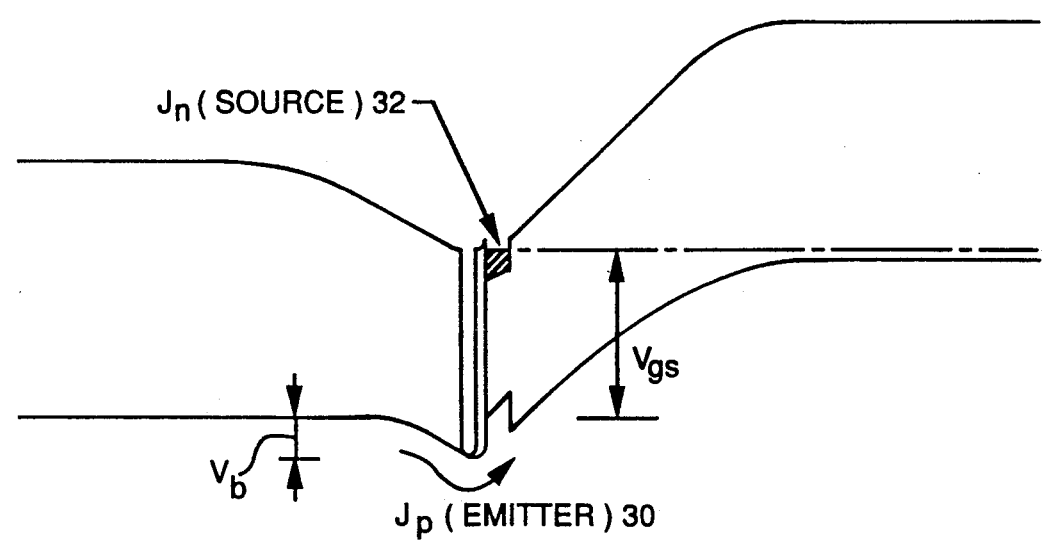

Refer first to the basic schematic structure of the prior art HFEL device illustrated in FIGS. 2, 3a and 3b. As shown in FIG. 2, and as described in the article, the HFEL was grown on a semi-insulating (SI) GaAs substrate 10 by molecular beam epitaxy. The layer sequence of the laser consisted of:

1. a layer 12 of 6000Å of p-GaAs for contact to the collector 13.

2. a layer 14 consisting of 6000Å of p-$Al_{0.4}GaAs$ for the lower cladding;

3. a layer consisting of 2000Å of p (undoped) AlGaAs, graded to GaAs, 75Å of undoped GaAs for the active region 16 and the FET Channel 18;

4. a layer 20 consisting of 20Å of undoped $Al_{0.25}GaAs$, 80Å of N-$Al_{0.25}GaAs$ to form the charge sheet 20;

5. a layer consisting of 2000Å of p-AlGaAs graded from 25% to 40% Al content, 1 μm of p-$Al_{0.4}GaAs$ to form the upper cladding layer 22; and 6. a layer 24 of 400Å of p-GaAs to form the ohmic contact region.

The growth and temperature rate for the GaAs were 700 degrees C. and 1.2 μm/h. The spacer layer 26 of 20Å serves to enhance the mobility of the undoped quantum well by moving the ionized donor centers away from the interface but is kept to a minimum to maximize the effect of the surface field produced by the donors.

In fabricating the HFEL device, The W emitter/gate 30 was deposited and patterned and then use as a mask to etch down to the top of the graded confinement layer. The source contact 32 and drain contact 13 were formed by ion implantation of Si to a depth of about 2000Å. A rapid thermal annealing was done at 950 degrees C. for 10 s. A mesa was etched down to the P-GaAs layer 12 to make collector contact and another wet etch to the substrate 10 isolates the total device. Au/Zn contacts 13 and 32 were made to the collector and Au/Ge/Ni contacts to the source by liftoff. The laser was formed by thinning and cleaving. An ion implant 40 was formed on both sides of the gate for symmetrical waveguiding, but only one source was accessed electrically.

It is noted the the FET structure naturally produces a ridge waveguid laser such that the active region is at no point exposed. The isolation by self-aligned implantation produces a natural index change for optimal guiding at the quantum well due to the index change from the increased doping and due to the disordering produced in the quantum well implant. Thus the implant is multipurpose, serving as injector and providing both electrical and optical confinement. Also because a pn junction is formed, surface leakage current are suppressed.

It is noted that the HFEL is a three terminal laser since both the collector and the gate (emitter) are available to inject holes into the quantum well. However, the collector can be used to independently control the state of the laser by changing the collection efficiency of the holes into the quantum well.

The energy diagrams of the prior art device of FIG. 2, through the gate both in the unbiased and lasing conditons are shown in FIGS. 3a and 3b. The equilibrium state of the device is determined by the FET threshold and may be by enhancement (no charge in the channel) or depletion with with inversion charge as shown in FIG. 3b. The threshold voltage of the FET is determined by the doping parameters $N_b$ (barrier doping), $N_a$ (collector doping), and $Q_o$ (sheet charge) and for the growth sequence here a depletion device is obtained by ($V_t = -4$ V). The normal region of operation of the FET is with gate/emitter voltages below the onset of gate conduction of holes over the barrier. The normal region of operation for the laser is with the gate voltage above this conducting value, as shown in FIG. 3b. The gate injects holes into the quantum well in the vertical direction and; the source and drain are biased to inject electrons into the channel. The electron current is a field-effect current and flows when the gate/emitter voltage exceeds the FET threshold voltage.

The improvement in accordance with this invention is the incorporation of a grating 42 in the ion implanted n+ well of the layer 14.

Figure 1:
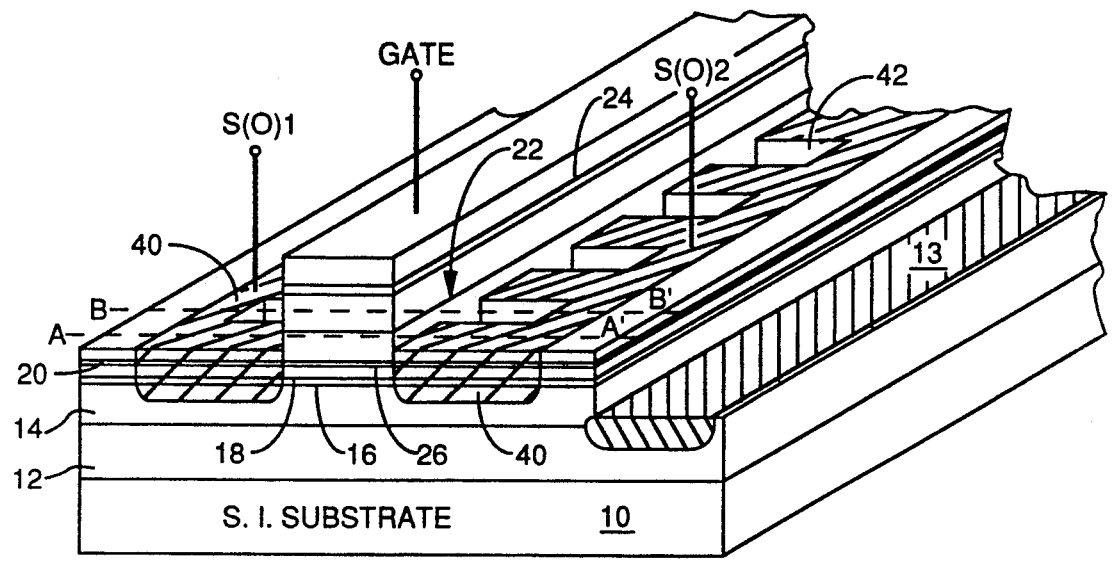
FIG. 1 a cross section of a isometric view of a preferred embodiment of the invention.

Referring now to FIG. 1, it will be recognized that the illustrated device is identical with the prior art FIGS. 2, 3a and 3b, the only difference being the inclusion of a periodic grating 42 formed in the active layer 14. The grating 42 may be produced by an electron beam lithographic patterning step, followed by a reactive ion etching process which will etch the periodic grating in the n+ wells that provide electronic lateral pumping to the active region. Aternately it may be produced by focused ion beam lithography which directly implants the grating and thus avoids the need for E beam lithography and reactive ion etching. Pumping the two self-aligned n+ wells then creates a periodic carrier density profile which in turn, through the known Kramers-Kronig relations, produces a periodic refractive index profile. Independent operation of the two n+ wells provides frequency tuning through simultaneous and independent control of the mode space or mode frequency and the DFB filter frequency. Potentially very high coupling coefficients can be achieved from this distributed feedback mechanism. High coupling coefficients allow shorter laser cavity lengths, improved external efficiencies and linewidths, lower thresholds and more efficient integration.

Wavelength selectivity is achieved through the use of the ion implanted lateral active grating 42 in the well 20 to obtain a single narrow linewidth emission. This has the added benefit that the grating decreases the required length to create the necessary gain at the selected wavelength, thereby increasing the speed of the device. The grating is formed by implanting the source and drain contacts, i.e., it is periodic in the vertical sidewall of the device lasing region, defined by the gate length. It uses the principal of electro-refraction to change the refractive index in a periodic manner when a bias voltage is applied to the contact, thereby resulting in wavelength selectivity.

In essence, as the energy passes through the active region, certain frequencies are reflected back and forth within the grating cavities allowing enhanced gain at those frequencies. On the other hand, those frequencies which are not resonant with the grating are not reflected before passing through the device, and therefore, the device amplifies wavelength selectively.

It will be apparent to a person skilled in the art that this invention is subject to various adaptations and modifications. It is intended therefore, that the scope of the invention be limited only by the appended claims as interpreted in the light of the prior art.

What is claimed is:

1. A distributed feedback laser to produce a single mode, stable and tunable operation comprising:
    a silicon substrate;
    an active layer comprising a p-doped narrow-bandgap semiconductor deposited on said silicon substrate;
    a biased collector contacting said active layer;
    a gate;
    a gate barrier deposited on the active layer between said gate and said active layer, said gate barrier including a very narrow n+ charge sheet on the active layer, the remainder of said barrier being p type;
    said biased collector comprising an ion implanted n+ well self aligned to said active layer; and
    a grating in said implanted n+ well, said grating having a plurality of reflective walls for producing a periodic carrier density profile, whereby said laser operates in a stable mode at the resonant frequency of said grating.

2. The laser as defined in claim 1 wherein said grating comprises a plurality of rectangular openings in said implanted well, said opening having lateral reflective surfaces therein for reflecting having a wavelength resonant to the distance between said reflective surface.

3. An optical device comprising a heterojunction field effect laser (HFEL) having a gate, a biased collector, and a cathode, said device having wavelength selectivity, said device incorporating a Grinsch layer structure with a single GaAs quantum well active region; and
    said wavelength selective means comprising an ion implanted grating self-aligned to said quantum well active region.

4. The optical device as defined in claim 3 wherein said grating is formed by implanting the source and drain contacts, and by etching said grating in said well to provide periodic electro-refraction in the vertical sidewall of the quantum well.

5. The optical device as defined in claim 3 wherein said grating is formed by implanting the source and drain contacts in the form of a grating where the implanted sections are self-aligned to the quantum well to provide periodic electro-refraction in the vertical sidewall of the quantum well.

* * * * *